United States Patent [19]

Hodge

[11] 3,930,114

[45] Dec. 30, 1975

[54] INTEGRATED CIRCUIT PACKAGE UTILIZING NOVEL HEAT SINK STRUCTURE

[75] Inventor: Robin H. Hodge, Menlo Park, Calif.

[73] Assignee: National Semiconductor Corporation, Santa Clara, Calif.

[22] Filed: Mar. 17, 1975

[21] Appl. No.: 558,643

[52] U.S. Cl. ........... 174/52 FP; 29/588; 174/16 HS; 264/272; 357/70; 357/72

[51] Int. Cl.$^2$ ........................................... H05R 9/02

[58] Field of Search ....... 174/52 PE, DIG. 3, 52 FP, 174/16 HS; 357/72, 70; 264/272; 29/627, 588

[56] References Cited

UNITED STATES PATENTS

| | | | |
|---|---|---|---|
| 3,444,309 | 5/1969 | Dunn | 174/52 PE |
| 3,629,672 | 12/1971 | Van de Water | 174/52 PE X |
| 3,689,683 | 9/1972 | Paletto et al. | 174/52 PE |
| 3,729,573 | 4/1973 | Dunn | 174/52 PE X |
| 3,767,839 | 10/1973 | Beal | 174/52 PE X |
| 3,839,660 | 10/1974 | Stryker | 174/52 PE X |

*Primary Examiner*—Darrell L. Clay

*Attorney, Agent, or Firm*—Lowhurst, Aine & Nolan

[57] ABSTRACT

An integrated circuit package for power applications including a novel heat sink structure affixed to the die mounting pad, the heat sink being exposed through the bottom surface of the plastic encapsulated package so as to be free of any plastic film covering, the heat sink being provided with two pairs of integral flexible fingers extending upwardly from the ends of the heat sink so as to engage the upper wall of the cavity mold in which the package is encapsulated and to hold the heat sink in place against the lower wall of the cavity mold.

2 Claims, 5 Drawing Figures

INTEGRATED CIRCUIT PACKAGE UTILIZING NOVEL HEAT SINK STRUCTURE

BACKGROUND OF THE INVENTION

Integrated circuit encapsulated packages, for example 14 lead dual in line packages used for power applications, incorporate a heat sink member for carrying away the heat generated by the integrated circuit chip mounted on the chip pad within the lead frame.

In fabrication, the IC chip is brazed to the upper surface of the mounting pad on the lead frame and the heat sink is brazed to the lower surface of the pad, the heat sink being considerably longer than the area of contact with the pad. A plurality of contact leads are spaced from and radiate out from the chip pad in the lead frame. Wires are bonded to the bonding pads on the chip and to the contact leads and serve to connect circuits within the IC with the associated terminal leads leading from the encapsulated package.

For encapsulating in plastic, the lead frame with IC chip and heat sink is placed into a molding machine where the two halves of the mold close and form a cavity about the IC structure. A molten plastic is then forced into the cavity in well known manner and hardens about the structure heat sink, the chip and chip pad, and the lead contacts to form a rigid encapsulation with the end terminals of the lead contacts protruding from the sides of the package to form the dual in line external terminals.

A number of packages are molded simultaneously, for example, in a 48 cavity mold with, for example, eight lead frame strips with six units on each strip, or an 80 cavity mold with eight lead strips and 10 units on each strip.

One problem with these encapsulated packages is that the heat sink is not fixedly mounted relative to the wall surfaces of the mold and the plastic tends to cover the outer surface of the heat sink member. This requires an additional fabrication step, after the molded package is released from the mold, of grinding off the plastic coating over the heat sink to expose the heat sink so that it may be thermally coupled to an external heat sink element, as by brazing, to insure the removal of the heat from the IC package in use.

A second problem with the heat sink is that it is large relative to the smaller area over which it is brazed to the die pad of the lead frame, and thus it has a tendency to float up and down in the mold during the introduction of the molten plastic. This at times causes the heat sink to float into contact with one or more of the separate contact leads of the lead frame, thus shorting these contact points to each other and to the heat sink, resulting in a defective IC package.

Another end result of this floating action is that the thickness of the plastic film covering the heat sink from one unit to the next is not contstant, and the grinding needed to expose the heat sinks in the various packages varies, resulting in a deviation in fabrication processing.

One form of improved encapsulated IC packages is shown and described in U.S. patent application Ser. No. 454,723 filed on Mar. 25, 1974 by Robert W. Beard entitled "Integrated Circuit Package Utilizing Novel Heat Sink Structure". This form of structure employs a modification in the size, shape, and positioning of the die pad support bars and the contact leads of the standard package.

SUMMARY OF THE PRESENT INVENTION

The present invention provides a novel IC package and method of fabrication wherein an internal heat sink is fixedly coupled to the IC chip mounting pad and extends completely through the plastic encapsulation from top to bottom. The molding cavity walls cooperate with the heat sink so that the heat sink is held firmly within the mold while the plastic is being forced into the mold cavity. Thus the heat sink may not float and accidentally short against the lead connectors within the lead frame.

The heat sink is provided with two pairs of integral flexible fingers extending upwardly from the ends of the heat sink. The ends of these fingers engage the upper wall of the cavity mold as it closes down around the IC structure during the plastic encapsulation stage. The flexible fingers give slightly and also force the bottom surface of the heat sink against the lower wall of the cavity mold to prevent any plastic from covering the lower surface of the heat sink.

DESCRIPTION OF THE PREFERRED EMBODIMENTS

Figure 1:
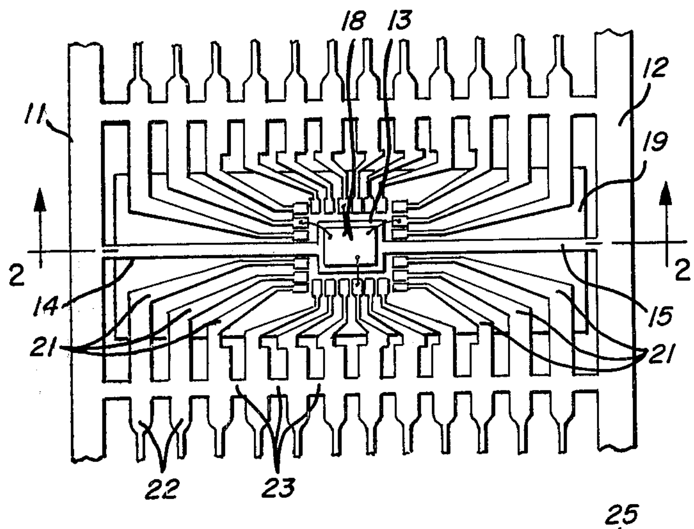
FIG. 1 is a view looking down upon an IC lead frame with the IC chip mounted in place according to the prior art.
Figure 2:
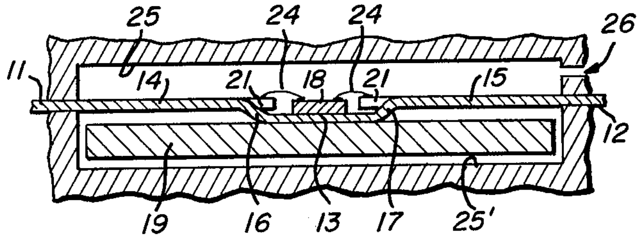
FIG. 2 is a cross section view of the structure of FIG. 1 shown in a plastic cavity mold prior to introduction of the molten plastic according to the prior art.

Referring now to FIGS. 1 and 2, the prior art technique of encapsulating a typical IC package is shown. The well known lead frame structure comprises the two side support strips 11 and 12 which run along the lengthy lead frame strip and support a plurality of separate IC lead frame support structures therebetween. Each separate lead frame structure comprises an IC attachment pad 13 centrally located within the frame and supported by a pair of pad support bars 14 and 15 extending outwardly with their outer ends integral with the side support strips 11 and 12.

The two pad support bars are bent downwardly slightly at 16 and 17 to hold the die attach pad 13 at a slightly lower level than the remainder of the frame structure.

An IC chip 18 is fixedly secured to the upper surface of the die attachment pad 13, as by brazing, the upper surface of the chip 18 being close to and even level with the remainder of the frame structure. An elongated copper heat sink 19 is brazed to the under side of the die attachment pad 13 for the purpose of carrying heat away from the IC in use. The actual area of contact to the attachment die 13 is relatively small compared to the overall size of the heat sink 19, and the outer portions of the heat sink 19 may move or float relative to the attachment pad.

A plurality of contact leads 21 extend in a radial-like direction from the die attachment pad 13 with their inner ends spaced slightly from the pad 13. These separate contact leads 21 thicken out as they extend away from the pad 13, terminating in thicker terminals 22 held together within the frame and between the side strips 11 and 12 by cross-bars 23. After encapsulation, these cross-bars 23 are removed to electrically isolate the terminals 22 one from the other.

Suitable connections are made by bonded wires 24 extending between bonding pads on the IC die 18 and the associated contact leads 21.

Elongated strips of these individual IC lead frames are placed in separate molding cavities 25 in a plastic molding machine where the individual devices are encapsulated in a suitable molded casing or encapsulant to rigidize the IC package and electrically isolate the various internal electrical connections. The molten plastic 26 is forced into the separate molding cavities 25 and it tends to move or float the heat sink 19 away from the cavity wall 25', since there is nothing establishing a fixed contact between heat sink 19 and cavity wall 25'. Thus, the outer wall surface of the heat sink 19 becomes coated with the plastic. In addition, the heat sink 19 may float up and make electrical contact with one or more of the individual electrical contacts 21, destroying the usefulness of the IC package.

After the encapsulated package is removed from the mold cavity 25, 25', grinding of the plastic film or covering is necessary to expose the heat sink 19 for subsequent soldering to the external heat sink mounting base for the device.

Figure 3:
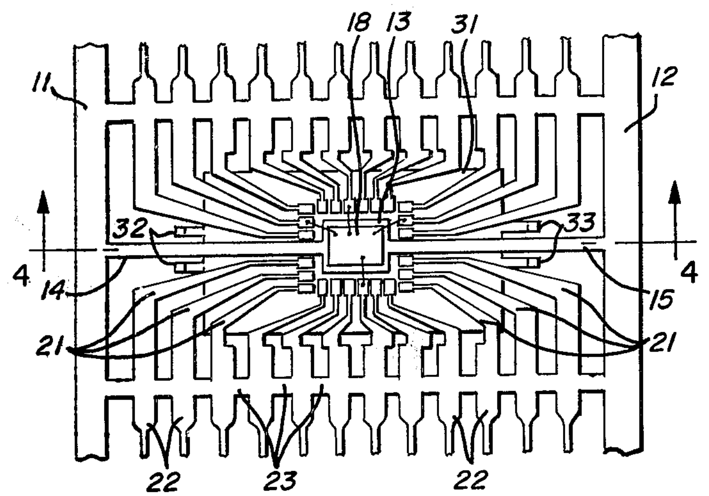
FIG. 3 is a view similar to FIG. 1 illustrating a novel form of heat sink incorporated in the device.
Figure 4:
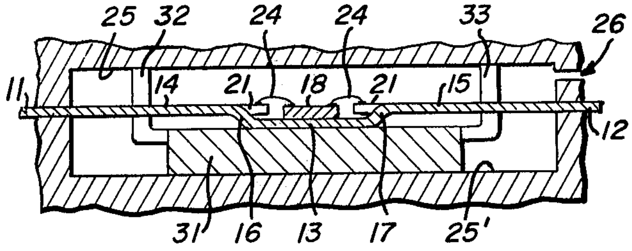
FIG. 4 is a cross section view similar to FIG. 2 showing the novel device in the cavity mold.
Figure 5:
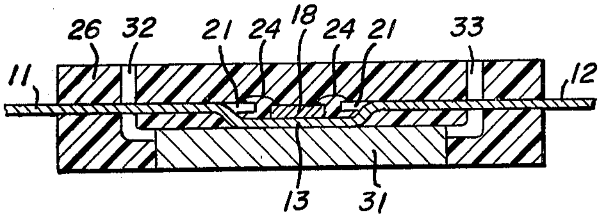
FIG. 5 is a cross section view similar to FIG. 4 showing the encapsulated device.

The novel IC package of the present invention is shown in FIGS. 3 through 5 and comprises a copper heat sink with a base portion 31 including an area for attachment to the die pad 13 and with two pairs of L-shaped flexible fingers 32 and 33 integral with an extending upwardly from opposite ends of the base portion 31. Finger pair 32 straddles support bar 14 and finger pair 33 straddles support bar 15, these fingers being spaced from the associated support bar.

The height of the heat sink from the bottom surface of the base 31 to the tips of the fingers 32, 33 is slightly greater than the internal height of the cavity mold when the upper and lower mold surfaces 25 and 25', respectively, are closed. Therefore, when the mold 25, 25' closes on the lead frame structure, the upper surface 25 engages the tips of the flexible fingers 32, 33 which yield and force the under surface of the heat sink 31 tightly against the lower mold surface 25'. The result is a pressure fit between the lower surface of the heat sink and the inner surface 25' of the cavity mold. No molten plastic can penetrate into this heat sink area. Thus, the base surface area of the heat sink remains free of plastic film and no grinding is needed to expose this copper heat sink surface when the encapsulant 26 has hardened.

What is claimed is:

1. A plastic encapsulated integrated circuit package comprising:

a lead frame including a flat die attachment pad having an IC die fixedly attached to one surface of said pad, a pair of pad support bars, one extending from each end of said pad out to the opposite ends of said encapsulated package, a metallic heat sink member fixedly attached to the other surface of said flat die attachment pad with its ends facing the ends of the package for conducting heat away from said IC die and die attachment pad in use, a plurality of connector leads spaced from said die attachment pad and elevated relative to said one surface of said die attachment pad, connector wires attached between contact pads on said die and associated connector lead ends, said connector leads extending out from said circuit package, a plastic molding encapsulating said die, said die attachment pad, said connector wires, said associated connector lead ends, and said heat sink member, and said heat sink member comprising a base portion having an external surface level with and exposed through one surface of said plastic molding, said base portion having two pairs of spring-like fingers extending upwardly from the upper surface thereof, one pair at either end of said heat sink member, each pair straddling the pad support bar passing from the associated end of the die attachment pad to the end of the package, the ends of said fingers extending through said plastic molding and having an external surface level with and exposed through the opposite surface of said plastic molding.

2. The method of encapsulating an integrated circuit package in a plastic in which the package comprises, a lead frame including, a flat die attachment pad having an integrated circuit die fixedly attached to one surface of said pad, a pair of pad support bars extending from each end of said pad, a plurality of connector leads spaced from said pad, connector wires attached between contact pads on said die and associated connector lead ends, and a metallic heat sink member fixedly attached to the other surface of said pad for conducting heat away from said die and said pad in use, said heat sink member including a base portion having a lower external surface and having two pairs of spring-like fingers extending upwardly from the upper surface thereof, one pair on either end of said heat sink member and each pair straddling a pad support bar, said method comprising the step of:

inserting the package into a mold which has a lower internal surface that conformingly engages the lower external surface of said heat sink member;

closing the mold and simultaneously engaging the upper surface of the said spring-like fingers with the upper internal surface of the mold to thereby urge the lower external surface of said heat sink firmly against said lower internal surface;

forcing a molten plastic into the mold;

solidifying the molten plastic to form the encapsulated integrated circuit package; and removing said encapsulated integrated circuit package from the mold.

* * * * *